(12) United States Patent
Sureka

(10) Patent No.: US 7,233,967 B2
(45) Date of Patent: Jun. 19, 2007

(54) REFLECTION FILTER

(75) Inventor: Anirudh Kailash Sureka, Union City, NJ (US)

(73) Assignee: LeCroy Corporation, Chestnut Ridge, NY (US)

( * ) Notice: Subject to any disclaimer, the term of this patent is extended or adjusted under 35 U.S.C. 154(b) by 371 days.

(21) Appl. No.: 10/933,859

(22) Filed: Sep. 3, 2004

(65) Prior Publication Data

US 2006/0053185 A1     Mar. 9, 2006

(51) Int. Cl.
    *G06F 17/10*     (2006.01)
(52) U.S. Cl. ..................................... 708/300
(58) Field of Classification Search ............... 708/300, 708/310, 314
    See application file for complete search history.

(56) References Cited

U.S. PATENT DOCUMENTS

| | | | |
|---|---|---|---|
| 4,672,638 A | | 6/1987 | Taguchi et al. |
| 5,784,236 A | * | 7/1998 | Tardiff et al. .................. 361/56 |
| 2004/0125945 A1 | * | 7/2004 | Davis et al. ........... 379/406.08 |

OTHER PUBLICATIONS

"Echo Cancellation in Speech and Data Transmission", David G. Messerschmidt; IEEE Journal on Selected Areas in Communications, vol. SAC-2, No. 2, Mar. 1984, pp. 283-297.

"Simplifying Adaptive Filter Design in Echo Cancellers", Frederic Bourget; Octasic; CommsDesign.com, Sep. 4, 2002, pp. 1-9.

"New Microchip to be Featured in Next Generation Echo Cancellers", Lucent Technologies (lucent.com), Jun. 3, 1996, pp. 1-2.

"Discussions on RF Signal Propagation and Multipath", NovAtel, Inc., Feb. 3, 2000, pp. 1-15.

* cited by examiner

Primary Examiner—Chuong D. Ngo
(74) Attorney, Agent, or Firm—Frommer Lawrence & Haug LLP; William S. Frommer

(57) ABSTRACT

A method and apparatus for generating a reflection filter. The method comprises the steps of determining an averaged step response of an acquired signal and generating a spectrum response from the averaged step response. A time at which a reflection in the averaged step response begins is determined and information in the averaged step response after the determined time when the reflection begins is replaced with an ideal flat line response to generate a required step response. A spectrum response is generated from the required step response and each frequency point of the spectrum response corresponding to the required step response is divided by each frequency point of the spectrum response corresponding to the averaged step response to generate a spectrum of the reflection filter. The result of the dividing step is processed to generate a reflection filter impulse response.

46 Claims, 6 Drawing Sheets

REFLECTION FILTER

BACKGROUND OF THE INVENTION

Electronic signals are acted upon by transmission through various systems, conduits or the like. These conduits have various inherent physical properties, one of them being impedance. This impedance is the total opposition to the flow of current offered by a circuit. A transmission line that is terminated with a load impedance equal to the characteristic impedance $Z_o$ of the line will not reflect an incident wave at that point, and the transmission line is said to be impedance matched. However, a transmission line that is terminated with a load impedance different than $Z_o$ will reflect part of an incident wave back toward the source or generator of the signal.

Reflections are often undesirable and should be eliminated. This is because at any point along the transmission line, that value of the signal will appear as a combination of the originally transmitted signal, and the reflected signal, thus resulting in distortion of the originally transmitted signal. Indeed, the voltage seen at any particular point on the line will be the vector sum of the transmitted and reflected sinusoids. Because the phase between the transmitted and reflected signals varies with position along the signal line, the vector sums at different points along the transmission paths will be different, thus affecting the actual signal present on the transmission line, and at the output thereof.

SUMMARY OF THE INVENTION

In accordance with the present invention, the reflections created in a signal when there is a change in the impedance of the signal path are used advantageously. When a high or low impedance is encountered in the signal path, a portion of the signal is reflected back in proportion to the impedance change. By obtaining the time at which reflection occurs on the signal, the impedance mismatch location can be pinpointed in the circuit. Once the location is known, in accordance with the invention, a predetermined algorithm is employed to generate a filter that is designed to offset any effects generated by the reflected signal. Filtering such a received signal with a Reflection Filter constructed in accordance with the invention removes the reflected waveform in the sampled signal without significantly effecting the rise time or overshoot of the signal.

Thus, a user is able to receive an output signal without any noise generated by the reflected signal, even when signal path geometry makes it impossible to precisely impedance match all components along the path.

Still other objects and advantages of the invention will in part be obvious and will in part be apparent from the specification and the drawings.

The invention accordingly comprises the several steps and the relation of one or more of such steps with respect to each of the others, and the apparatus embodying features of construction, combination(s) of elements and arrangement of parts that are adapted to effect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

The present invention is preferably implemented in an oscilloscope, thus allowing for the filtering of signals that are to be tested and viewed on the oscilloscope. However, the invention is not so limited, and may be implemented, in part or in whole, on any electronic instrument that would find benefit from removing the effects of a reflected signal from a signal transmission path.

Figure 2:
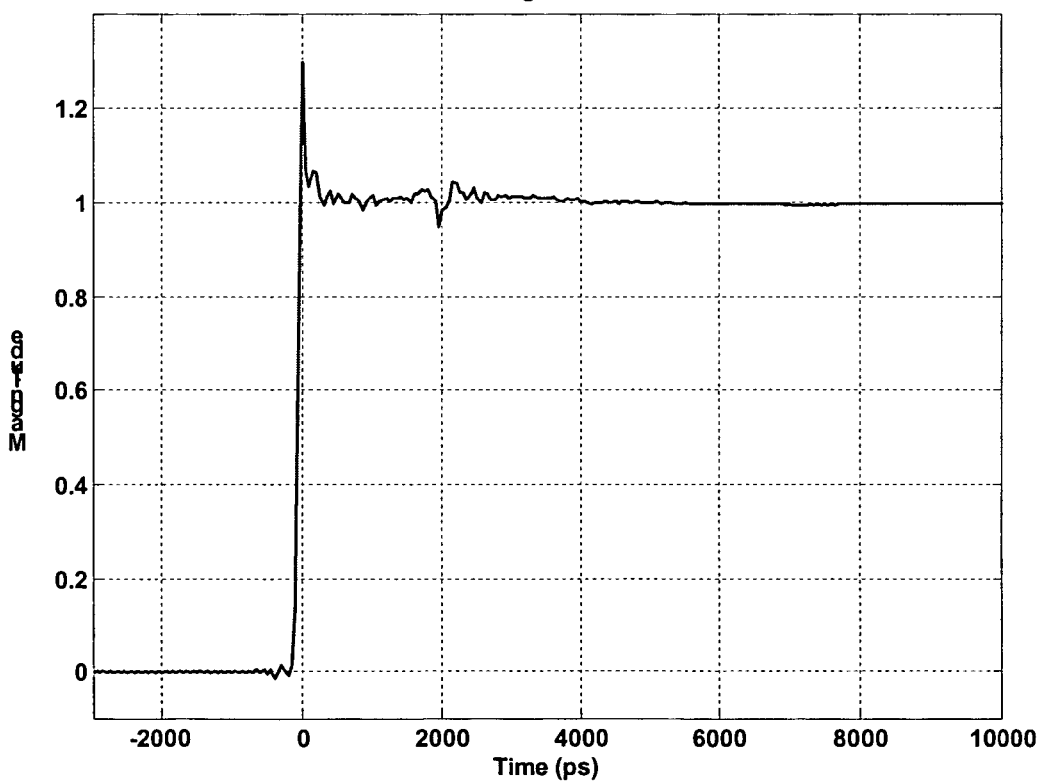
FIG. 2 is a step response of an information signal from which the frequency spectrum response of FIG. 1 was generated.
Figure 10:
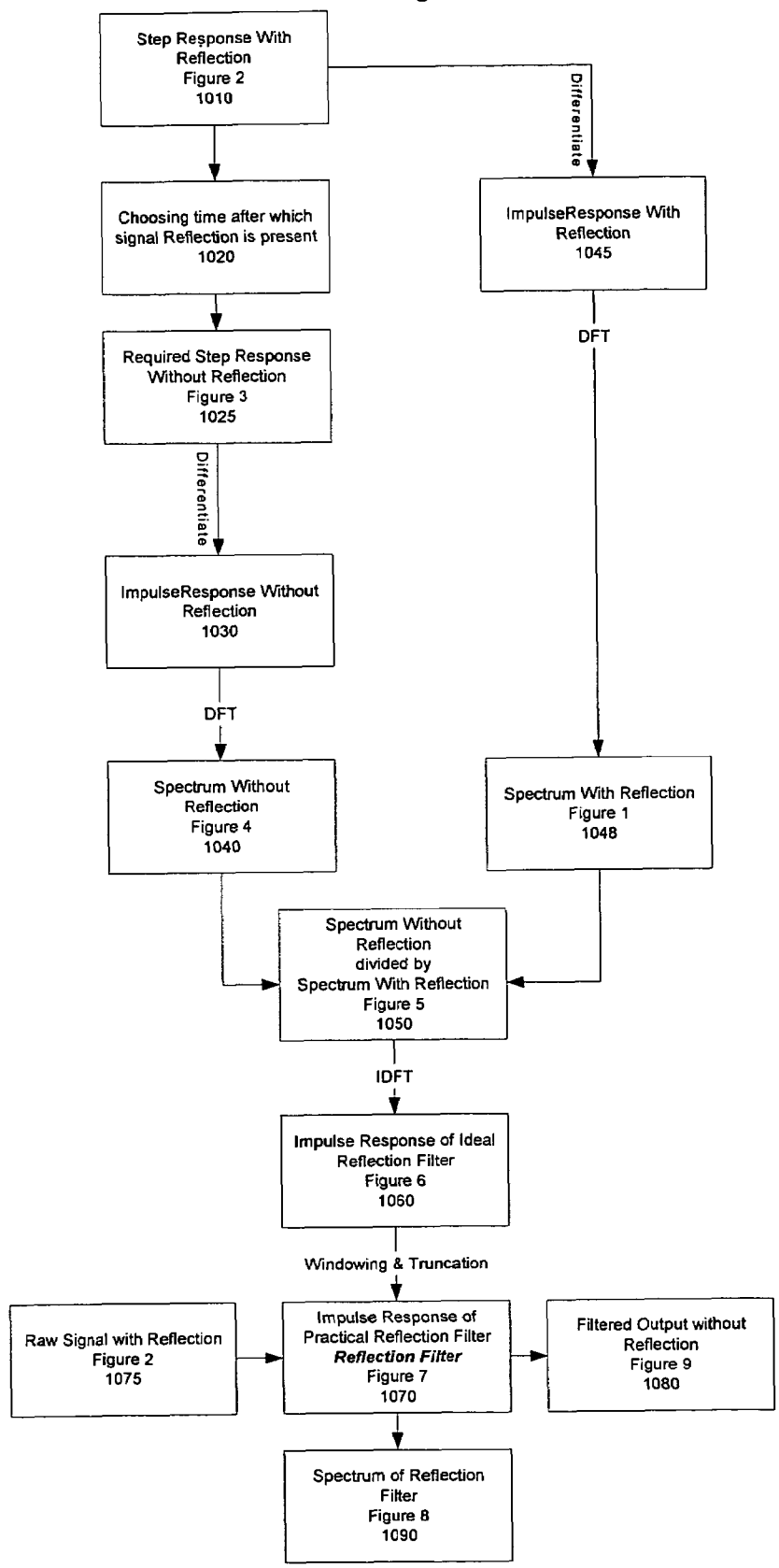
FIG. 10 is a flow chart depicting reflection building processing in accordance with one embodiment of the invention

Referring next to the figures, a first embodiment of the invention will now be described. FIG. 10 is a flowchart showing the overall processing of the reflection filter building process in accordance with the invention. As is shown in FIG. 10, at step 1010, a step response including a reflected signal is obtained. Such a signal is shown in FIG. 2, which depicts an Averaged Step response from the system having a reflection. A multiple number of step responses are acquired with the same system settings and trigger position. These responses at each point for the different step responses are added and then divided by the total number of acquisitions to give the Averaged Step response. This procedure is shown in equation 1, which depicts the averaging of M step responses, each having N sample points $$y_{Avg.original_{step}}[i] = \frac{1}{M} \times \sum_{j=1}^{M} y_j[i] \qquad 1)$$

$$i = 0 \ldots N-1$$

For nomenclature, we further define x as being equal to the averaged original as follows in equation 2.

$$x_{original_{step}} = y_{Avg.original_{step}} \qquad 2)$$

When performing this acquisition and averaging procedure, it is important that the system settings and the trigger position do not change between acquisitions; otherwise the averaging may give incorrect results. The averaged Step response can be sampled at any sample rate. If the sample rate of the eventual required reflection filter is different than the sample rate of the Averaged Step, interpolation or decimation will be employed to have the Averaged Step response sample rate equal the sample rate at which the reflection filter is to be applied. The averaging procedure noted above is performed on the sampled waveform to reduce random noise in the signal, which changes from acquisition to acquisition. This allows the user to view system characteristics in the signal more clearly. Instead of averaging the step signal it is also possible to obtain the step containing the reflection signal by using the averaged spectrum and then converting that information in time domain using Fourier transform.

Referring back to FIG. 10, processing passes to step 1020. In step 1020, once the Averaged Step response has been obtained, it is examined to determine at what time the reflection begins. An ideal step response would have a value of zero until the stepped input occurs. Immediately upon receipt of the step input, the value will be one. Step responses from actual physical systems are typically far from the ideal step response. The imperfections in the actual responses are a result of many factors, some of which include bandwidth limitations and less than ideal roll-off of the frequency response of practical systems. These imperfections manifest themselves as overshoot and ringing in the step responses, for example. Overshoot and ringing, though not present in the ideal step response, should not be considered to have been generated by a signal reflection in the system. As noted above, reflection is caused by a change of impedance in the signal path. Overshoot and ringing, on the other hand, are caused by bandwidth limitations and roll-off of the system. If the source of reflection in the signal path, i.e. the impedance change in the circuit path, generates a reflection of the signal that appears at the output of the system too close in time to the step input, it is likely that the effects of the reflected signal on the output signal will combine with the overshoot and ringing effects on the output signal, thus making it very difficult to perform only reflection correction without affecting the overshoot and ringing effects of the signal. Therefore, preferably a first impedance mismatch in the signal path is located far enough away from the output of the system so that a reflection start point is able to be chosen at a location in the output signal that is after the ringing and overshoot responses of the signal have settled down. By close examination of the example signal depicted in FIG. 2, it is determined that the reflection in the example signal starts at approximately 400 ps after the rising edge.

Figure 3:
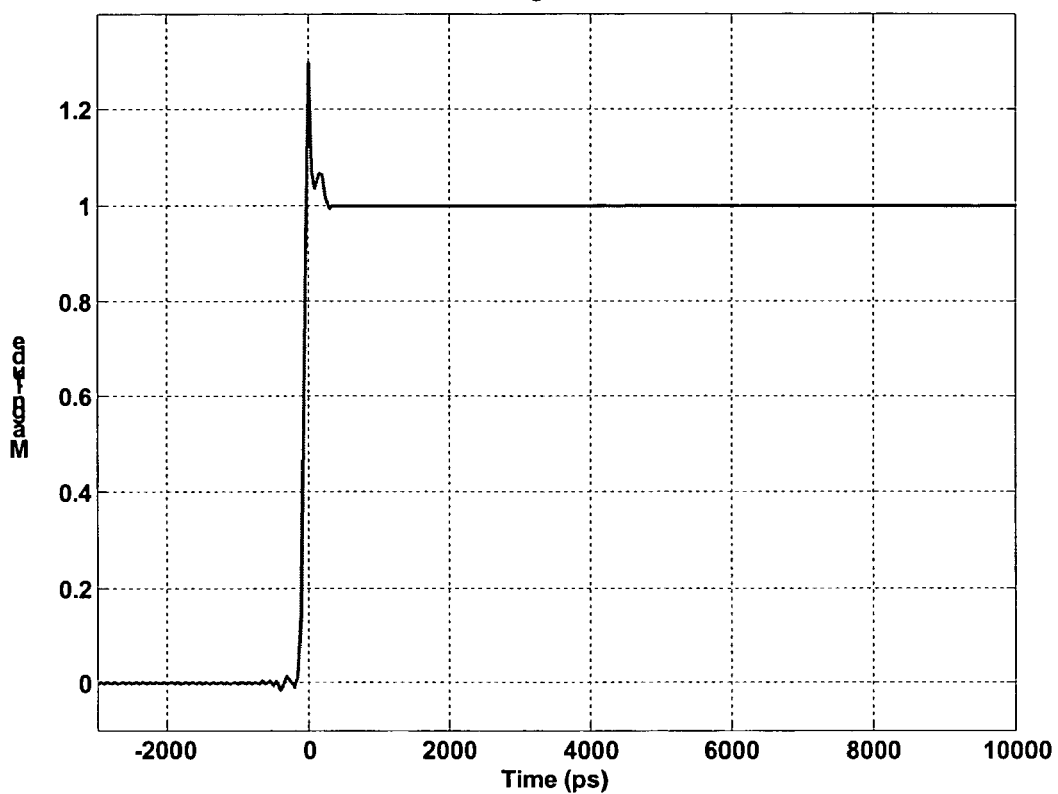
FIG. 3 is an required step response of an information signal that would result if a reflected signal were removed.

In order to remove the effects of the detected reflection from the signal, first an required reflection removed signal is constructed at step 1025 of FIG. 10. This is the required response that would preferably be obtained if there were no impedance mismatch, and therefore nor reflection, in the signal. Constructing such an required response is performed by first determining a time at which reflection starts in the original waveform, as noted above. After this time has been determined, the information in the data signal resulting from the reflection is replaced by an ideal flat line response, as is shown in FIG. 3. This required step response therefore mimics a response that would ideally be generated if there were no reflection in the system. This required system response is used as a reference response for generating a reflection filter in accordance with the invention.

This required response is determined in accordance with the following equations 3-. In equation 3, startIndex is set to be the designated point from which the reflection signal is believed to start, as determined above. The required step response is therefore defined equations 3 and 4 as follows:

$$x_{required_{step}}[i]=x_{original_{step}}[i] \text{ for } i=0 \ldots \text{startIndex}-1$$
and
$$x_{required_{step}}[i]=P \text{ for } i=\text{startIndex} \ldots N-1 \quad 3)$$

where P is a constant determined by averaging the values occurring after the startIndex of the original step response so as to determine the value that should be applied to the replacement straight line in FIG. 3, as shown in equation 5.

$$P = \frac{1}{N - startIndex} \times \sum_{j=startIndex}^{N-1} x_{original_{step}}[j] \quad 5)$$

Next, this required step response of FIG. 3 is differentiated in accordance with equation 6, resulting in a corresponding required impulse response shown at step 1030 of FIG. 10.

$$x_{required_{impulse}}[i]=x_{required_{step}}[i+1]-x_{required_{step}}[i] \; i=0 \ldots N-2. \quad 6)$$

To ensure that the impulse response is the same size as the step response, the last value of the impulse response is repeated, as shown in equation 7:

$$x_{required_{impulse}}[N-1]=x_{required_{impulse}}[N-2] \quad 7)$$

The DFT of this required impulse response is in turn taken in accordance with equation 8, resulting in a spectrum corresponding to the required step response at step 1040.

$$X_{required_{spectrum}}[k] = \sum_{n=0}^{N-1} x_{required_{step}}[n] \cdot e^{\frac{-j2\pi kn}{N}} \; k = 0 \ldots N-1 \quad 8)$$

Figure 4:
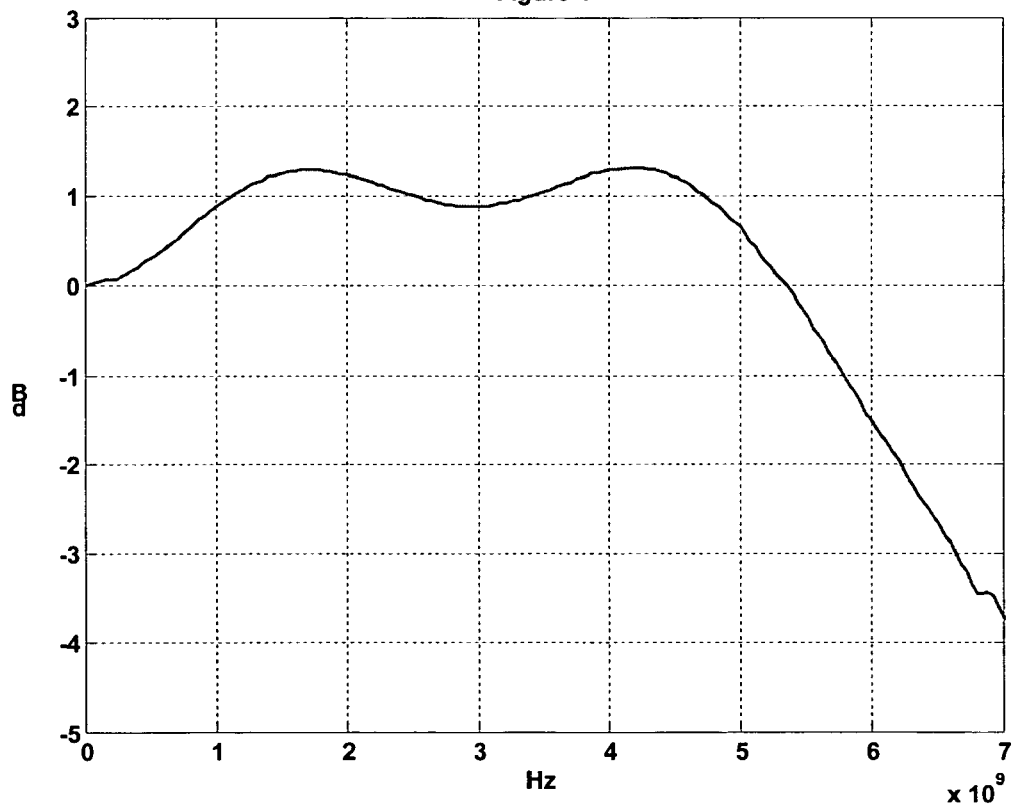
FIG. 4 is a frequency response spectrum of the required step response of FIG. 3.

FIG. 4 shows this spectrum, and represents the required reflection removed spectrum.

During processing of the required spectrum in accordance with steps 1020, 1025, 1030 and 1040 (or at another convenient time), a spectrum of the step response shown in FIG. 2 is obtained by first differentiating the step response points of FIG. 2 at step 1045 to generate an impulse response of the step response of FIG. 2. This differentiation is shown in equation 9:

$$x_{original_{impulse}}[i]=x_{original_{step}}[i+1]-x_{original_{step}}[i] \quad i=0 \ldots N-2 \quad 9)$$

As with the required response, to ensure that the impulse response is the same size as the step response, we repeat the last value of the impulse response, as shown in equation 10:

$$x_{original_{impulse}}[N-1]=x_{original_{impulse}}[N-2] \quad 10)$$

Thereafter, at step 1048, the DFT of the generated impulse response is taken in accordance with equation 11, resulting in the spectrum of the system for which the step response of FIG. 2 was obtained.

$$X_{original_{spectrum}}[k] = \sum_{n=0}^{N-1} x_{original_{step}}[n] \cdot e^{\frac{-j2\pi kn}{N}} \; k = 0 \ldots N-1 \quad 11)$$

Figure 1:
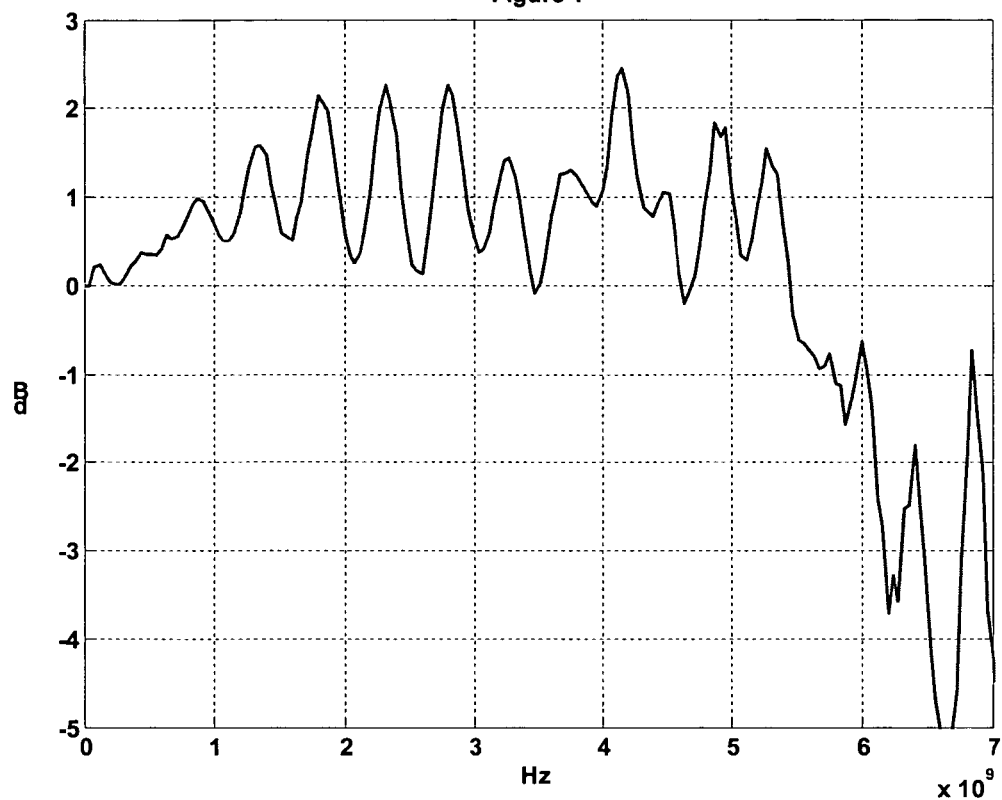
FIG. 1 is a frequency spectrum response of an information signal.

FIG. 1 depicts this resulting spectrum of the system of which the step response signal of FIG. 2 was obtained. As is evident from FIG. 1, some ripple is present in the frequency spectrum. This ripple is caused by the reflection detected in the step response.

As is further evident from the spectrum of the required step response of FIG. 4, the ripples in the spectrum depiction of FIG. 1 that were caused by the reflection are no longer present. Thus, in the spectrum of FIG. 4 obtained from the required step response of FIG. 4, the effects of the reflection have been removed. A smooth spectrum is generated.

After generation of the spectrum of the required step response and the spectrum of the original step response signal, the spectrum of a desired raw reflection filter (FIG. 5) is obtained by dividing each frequency point of the spectrum of the required step response by the corresponding points of the frequency response obtained of the step response including the reflection at step 1050. This process is shown in equation 12:

$$x_{Raw\text{-}reflectionFilter_{spectrum}}[k] = \frac{X_{required_{spectrum}}[k]}{X_{original_{spectrum}}[k]} \quad 12)$$

$$k = 0 \ldots N-1$$

The spectrums have both magnitude and phase information in the complex data. Both magnitude and phase are considered while generating the reflection filter to ensure similar overshoot and ringing effects in the eventual filtered system as were present in the original response without filtering. The reflection filter only effects the original signal after the previously determined starting time of the reflection.

Figure 5:
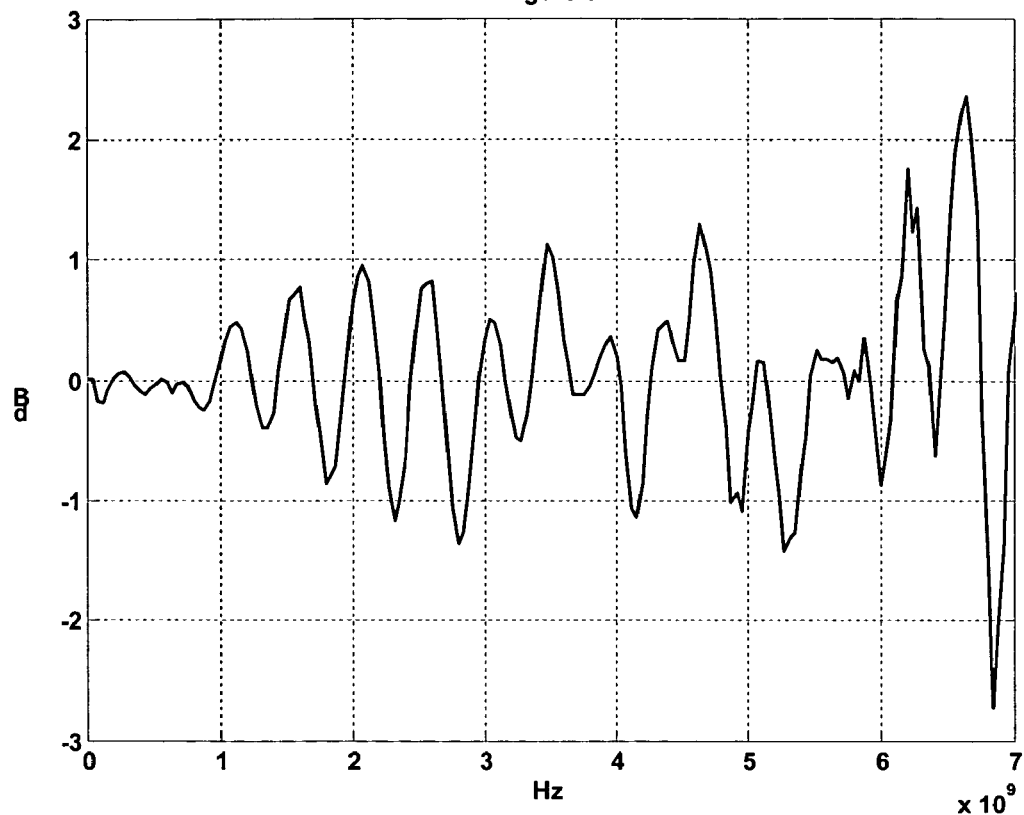
FIG. 5 is a frequency response spectrum of an required response filter based upon the spectrums of FIGS. 4 and 1.
Figure 6:
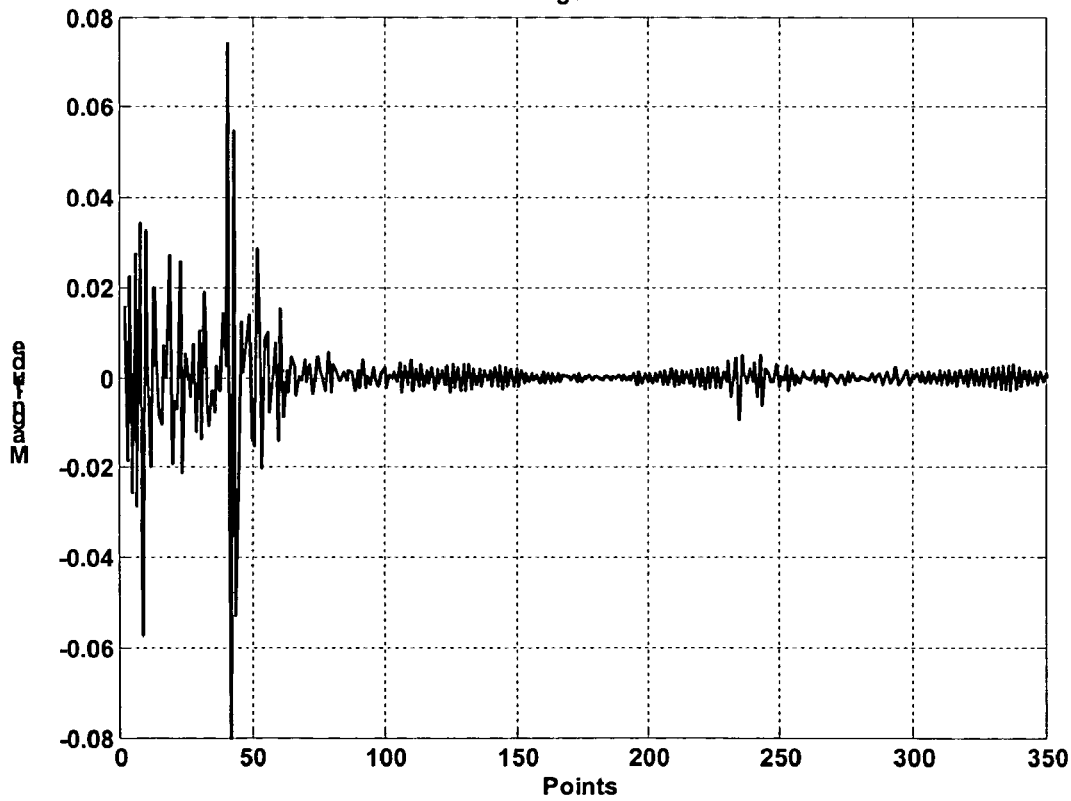
FIG. 6 is an impulse response of the frequency response spectrum of FIG. 5.

Processing next proceeds to step 1060, where the impulse response of the spectrum of the desired raw reflection filter of FIG. 5 is generated by taking the inverse Fourier Transform thereof, resulting in the impulse response shown in FIG. 6. This inverse Fourier Transform is generated in accordance with equation 13:

$$x_{Raw\text{-}reflectionFilter_{impulse}}[n] = \frac{1}{N}\sum_{k=0}^{N-1} X_{Raw\text{-}reflectionFilter_{spectrum}}[k] \cdot e^{\frac{j2\pi kn}{N}} \quad 13)$$

$$n = 0 \ldots N-1$$

This inverse Fourier Transform of the spectrum of FIG. 5 generates raw reflection filter taps. This reflection filter is considered "raw" because some processing of the filter is still required before use, such as like windowing and truncation of the generated taps.

This impulse response is then windowed and truncated in step 1070, resulting in a smaller length reflection filter. To perform this windowing and truncating, the impulse response is first multiplied with a Hanning window, in this preferred embodiment. The Hanning window is generated in accordance with equation 14:

$$w_{hanning}[i] = 0.5 - 0.5 \cdot \cos\left(\frac{2\pi(i+N)}{2N}\right) \quad i = 0 \ldots N-1 \quad 14)$$

Windowing of the impulse response is performed to reduce any spectral leakage of the frequency response. This win-dowing is performed by multiplying the Hanning window with the raw reflection filter impulse response to generate a windowed impulse response in accordance with equation 15:

$$x_{windowedreflection_{impulse}}[n] = x_{Raw\text{-}reflectionFilter_{impulse}}[n] \cdot w_{hanning}[n] \quad n=0 \ldots N-1 \quad 15)$$

Figure 7:
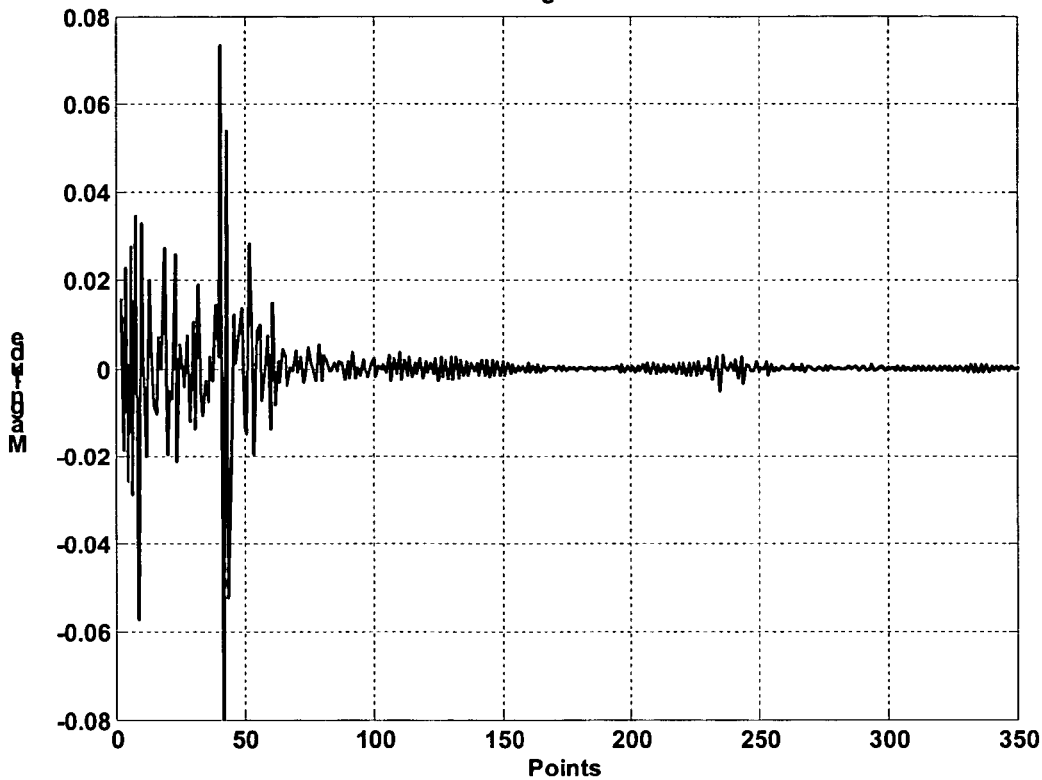
FIG. 7 is a reflection filter comprising a windowed and truncated version of the impulse response of FIG. 6.
Figure 8:
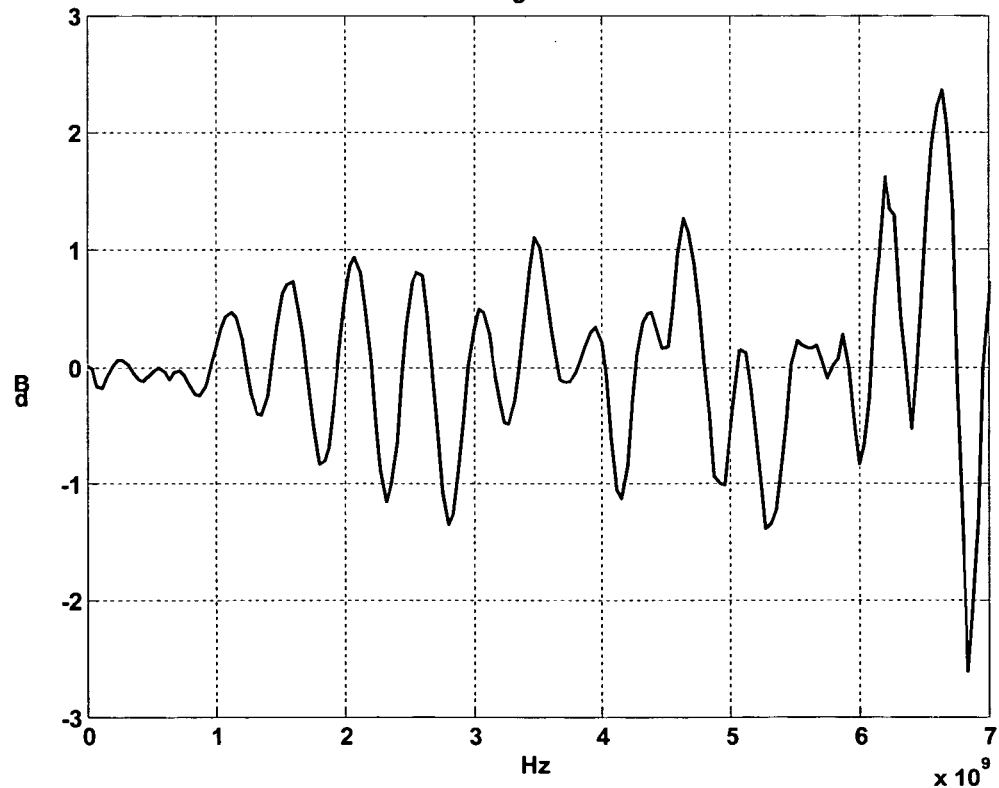
FIG. 8 is a frequency response of the impulse response of FIG. 7.

The windowed impulse response is then truncated, and the generated points are used as the reflection filter coefficients. The response is truncated to remove all points which are too small in value (usually below a predetermined threshold value) to make any significant change in the frequency response of the reflection filter. The threshold value is selected such that when the value of the windowed reflection impulse response becomes less than the predetermined threshold value the remaining portion of the impulse response is truncated. By removing these values, a smaller number of coefficients are required in the filter, making the filter more efficient. This truncation procedure is shown in equation 16:

$$x_{ReflectionFilterTaps}[n] = x_{windowedreflection_{impulse}}[n]$$
$$n=0 \ldots K-1 \quad 16)$$

where $K<=N$ and $abs(x_{windowedreflection_{impulse}}[n])>$ Threshold Value for all $n=0 \ldots K-1$ This truncated filter is the final reflection filter generated in accordance with the invention, and is shown in FIG. 7. This final reflection filter is preferably implemented as a Finite Impulse Response (FIR) filter, employed to remove the reflection from any signal input to the system. The frequency response of the filter resulting from the windowed and truncated impulse response is generated at step 1090, and is shown in FIG. 8.

Figure 9:
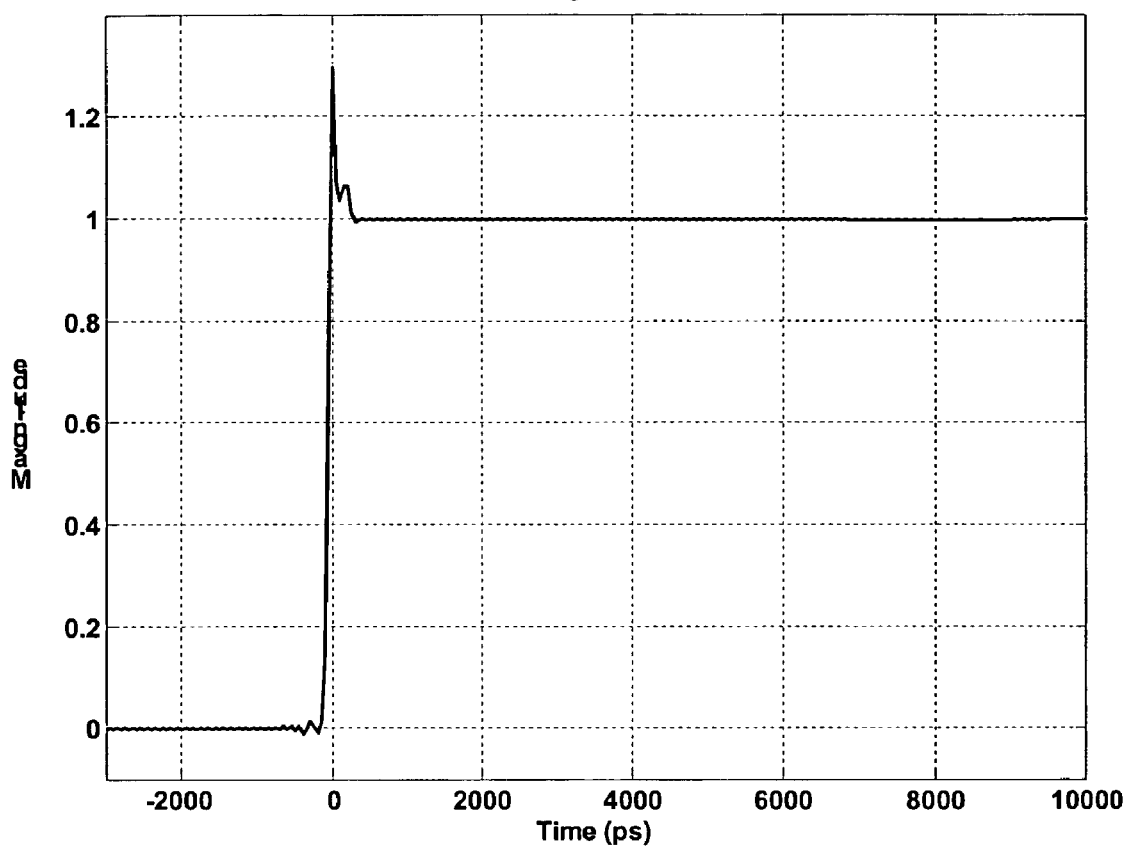
FIG. 9 is a filtered version of the step response information signal of FIG. 2 employing the reflection filter frequency response of FIG. 8.

During operation, and in order to verify the success of the filter building algorithm, a step signal (such as that shown in FIG. 2, and represented at step 1075) with reflection is passed through the generated filter. The resulting output signal at step 1080, and as shown in FIG. 9, is displayed as a step response with the system reflection removed. The removal of this reflection has no visible effect on overshoot or rise time of the signal. The reflection filter has acted on and removed only the reflection signal from the originally acquired signal.

While the invention has primarily been described with respect to a method for performing the steps of the invention, it should be understood that the invention is also intended to include various processing platforms, such as oscilloscopes, that will implement such processing. As is known in the art, these processing apparatuses include at least acquisition modules, memory, processors, displays and output modules. Therefore such a processing apparatus, as well as software intended to run on these apparatuses to implement the above described method is considered to be part of the invention.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A method for generating a reflection filter, comprising the steps of:
    determining a step response of an acquired signal;
    generating a spectrum response from the determined step response;
    determining a time at which a reflection in the determined step response begins;
    replacing information in the determined step response after the determined time when the reflection begins with an ideal flat line response to generate a required step response;
    generating a spectrum response from the required step response;
    dividing each frequency point of the spectrum response corresponding to the required step response by each frequency point of the spectrum response corresponding to the determined step response to generate a spectrum of the reflection filter; and
    processing the result of the dividing step to generate a reflection filter impulse response.

2. The method of claim 1, further comprising the steps of:
    windowing the reflection filter impulse response; and
    truncating the reflection filter impulse response.

3. The method of claim 2, wherein the windowing is performed by multiplying a Hanning window with the reflection filter impulse response.

4. The method of claim 2, wherein one or more points generated upon truncating of the reflection filter impulse response are used as the reflection filter coefficients.

5. The method of claim 1, wherein the reflection filter impulse response is implemented as a Finite Impulse Response (FIR) filter.

6. The method of claim 1, wherein the spectrum response is generated from the determined step response by:
    differentiating the determined step response to generate an impulse response of the determined step response; and
    determining a Discrete Fourier Transform (DFT) of the impulse response of the determined step response.

7. The method of claim 1, wherein the spectrum response is generated from the required step response by:
    differentiating the required step response to generate an impulse response of the required step response; and
    determining a Discrete Fourier Transform (DFT) of the impulse response of the required step response.

8. The method of claim 1, wherein the time at which a reflection in the determined step response begins is determined to be at a time after any effects on the signal due to ringing and overshoot have substantially settled.

9. The method of claim 1, wherein the processing of the result of the dividing step to generate a reflection filter impulse response comprises performing an inverse Fourier Transform on the result of the dividing step.

10. The method of claim 1, wherein the determined step response is an average of a number of acquired step responses derived from said signal.

11. A method for generating a reflection filter, comprising the steps of:
    measuring a predetermined number of step responses;
    averaging the measured step responses to generate an averaged step response of the measured step responses;
    determining a time at which a reflection in the averaged step response begins;
    replacing information in the averaged step response after the determined time when the reflection begins with an ideal flat line response to generate a required step response;
    differentiating the required step response to generate an impulse response of the required step response;
    determining a Discrete Fourier Transform (DFT) of the impulse response of the required step response to generate a spectrum response from the required step response;
    differentiating the averaged step response to generate an impulse response of the averaged step response;
    determining a Discrete Fourier Transform (DFT) of the impulse response of the averaged step response to generate a spectrum response from the averaged step response;
    dividing each frequency point of the spectrum response corresponding to the required step response by each frequency point of the spectrum response corresponding to the averaged step response to generate a spectrum of the reflection filter;
    performing an inverse Fourier Transform on the result of the dividing step to generate a reflection filter impulse response;
    windowing the reflection filter impulse response; and
    truncating the reflection filter impulse response.

12. A method for generating a reflection filter for use in an oscilloscope, comprising the steps of:
    acquiring a waveform having a step response by the oscilloscope;
    determining a step response of the acquired waveform;
    generating a spectrum response from the determined step response;
    determining a time at which a reflection in the determined step response begins;
    replacing information in the determined step response after the determined time when the reflection begins with an ideal flat line response to generate a required step response;
    generating a spectrum response from the required step response;
    dividing each frequency point of the spectrum response corresponding to the required step response by each frequency point of the spectrum response corresponding to the determined step response to generate a spectrum of the reflection filter; and
    processing the result of the dividing step to generate a reflection filter impulse response for implementation in the oscilloscope.

13. The method of claim 12, wherein the determined step response is an average of a number of acquired step responses derived from said waveform.

14. A processing apparatus for generating a reflection filter, comprising:
    means for determining a step response of an acquired signal;
    means for generating a spectrum response from the determined step response;
    means for determining a time at which a reflection in the determined step response begins;
    means for replacing information in the determined step response after the determined time when the reflection begins with an ideal flat line response to generate a required step response;
    means for generating a spectrum response from the required step response;
    means for dividing each frequency point of the spectrum response corresponding to the required step response by each frequency point of the spectrum response corresponding to the determined step response to generate a spectrum of the reflection filter; and means for processing the result from the dividing means to generate a reflection filter impulse response.

15. The apparatus of claim 14, further comprising:
means for windowing the reflection filter impulse response; and
means for truncating the reflection filter impulse response.

16. The apparatus of claim 15, wherein the means for windowing performs the windowing by multiplying a Hanning window with the reflection filter impulse response.

17. The apparatus of claim 15, wherein one or more points generated upon truncating of the reflection filter impulse response are used as the reflection filter coefficients.

18. The apparatus of claim 14, wherein the reflection filter impulse response is implemented as a Finite Impulse Response (FIR) filter.

19. The apparatus of claim 14, wherein the means for generating a spectrum response from the determined step response further comprises:
means for differentiating the determined step response to generate an impulse response of the determined step response; and
means for determining a Discrete Fourier Transform (DFT) of the impulse response of the determined step response.

20. The apparatus of claim 14, wherein the means for generating a spectrum response from the required step response further comprises:
means for differentiating the required step response to generate an impulse response of the required step response; and
means for determining a Discrete Fourier Transform (DFT) of the impulse response of the required step response.

21. The apparatus of claim 14, wherein the means for determining a time at which a reflection in the determined step response begins determines the time at which the reflection in the determined step response begins to be at a time after any effects on the signal due to ringing and overshoot have substantially settled.

22. The apparatus of claim 14, wherein the means for processing the result from the dividing means to generate a reflection filter impulse response performs an inverse Fourier Transform on the result from the dividing means.

23. The apparatus of claim 14, wherein the determined step response is an average of a number of acquired step responses derived from said signal.

24. An apparatus for generating a reflection filter, comprising:
means for measuring a predetermined number of step responses;
means for averaging the measured step responses to generate an averaged step response of the measured step responses;
means for determining a time at which a reflection in the averaged step response begins;
means for replacing information in the averaged step response after the determined time when the reflection begins with an ideal flat line response to generate a required step response;
means for differentiating the required step response to generate an impulse response of the required step response;
means for determining a Discrete Fourier Transform (DFT) of the impulse response of the required step response to generate a spectrum response from the required step response;
means for differentiating the averaged step response to generate an impulse response of the averaged step response;
means for determining a Discrete Fourier Transform (DFT) of the impulse response of the averaged step response to generate a spectrum response from the averaged step response;
means for dividing each frequency point of the spectrum response corresponding to the required step response by each frequency point of the spectrum response corresponding to the averaged step response to generate a spectrum of the reflection filter;
means for performing an inverse Fourier Transform on the generated spectrum of the reflection filter to generate a reflection filter impulse response;
means for windowing the reflection filter impulse response; and
means for truncating the reflection filter impulse response.

25. An apparatus for generating a reflection filter, comprising:
a processor, the processor performing the steps of:
determining a step response of an acquired signal;
generating a spectrum response from the determined step response;
determining a time at which a reflection in the determined step response begins;
replacing information in the determined step response after the determined time when the reflection begins with an ideal flat line response to generate a required step response;
generating a spectrum response from the required step response;
dividing each frequency point of the spectrum response corresponding to the required step response by each frequency point of the spectrum response corresponding to the determined step response to generate a spectrum of the reflection filter; and
processing the result of the dividing step to generate a reflection filter impulse response.

26. The apparatus of claim 25, wherein the processor further performs the steps of:
windowing the reflection filter impulse response; and
truncating the reflection filter impulse response.

27. The apparatus of claim 26, wherein the processor further performs the step of multiplying a Hanning window with the reflection filter impulse response to perform the windowing.

28. The apparatus of claim 26, wherein the processor uses one or more points generated upon truncating of the reflection filter impulse response as the reflection filter coefficients.

29. The apparatus of claim 25, wherein the processor further implements the reflection filter impulse response as a Finite Impulse Response (FIR) filter.

30. The apparatus of claim 25, wherein the processor, to generate the spectrum response from the determined step response, further performs the steps of:
differentiating the determined step response to generate an impulse response of the determined step response; and
determining a Discrete Fourier Transform (DFT) of the impulse response of the determined step response.

31. The apparatus of claim 25, wherein the processor, to generate the spectrum response from the required step response, further performs the steps of:
differentiating the required step response to generate an impulse response of the required step response; and determining a Discrete Fourier Transform (DFT) of the impulse response of the required step response.

32. The apparatus of claim 25, wherein the processor determines the time at which a reflection in the determined step response begins to be at a time after any effects on the signal due to ringing and overshoot have substantially settled.

33. The apparatus of claim 25, wherein the processor performs an inverse Fourier Transform on the result of the dividing step in order to process the result of the dividing step to generate a reflection filter impulse response.

34. The apparatus of claim 25, wherein the determined step response is an average of a number of acquired step responses derived from said signal.

35. An oscilloscope for generating a reflection filter, comprising:
a processor, the processor performing the steps of:
acquiring a waveform having a step response by the oscilloscope;
determining a step response of the acquired waveform;
generating a spectrum response from the determined step response;
determining a time at which a reflection in the determined step response begins;
replacing information in the determined step response after the determined time when the reflection begins with an ideal flat line response to generate a required step response;
generating a spectrum response from the required step response;
dividing each frequency point of the spectrum response corresponding to the required step response by each frequency point of the spectrum response corresponding to the determined step response to generate a spectrum of the reflection filter; and
processing the result of the dividing step to generate a reflection filter impulse response for implementation in the oscilloscope.

36. The oscilloscope of claim 35, wherein the determined step response is an average of a number of acquired step responses derived from said waveform.

37. A computer program embodied in a computer-readable medium to control a processing apparatus, the computer program including instructions to perform the steps of:
determining a step response of an acquired signal;
generating a spectrum response from the determined step response;
determining a time at which a reflection in the determined step response begins;
replacing information in the determined step response after the determined time when the reflection begins with an ideal flat line response to generate a required step response;
generating a spectrum response from the required step response;
dividing each frequency point of the spectrum response corresponding to the required step response by each frequency point of the spectrum response corresponding to the determined step response to generate a spectrum of the reflection filter; and
processing the result of the dividing step to generate a reflection filter impulse response.

38. The computer program of claim 37, further comprising instructions for: windowing the reflection filter impulse response; and truncating the reflection filter impulse response.

39. The computer program of claim 38, further comprising an instruction for multiplying a Hanning window with the reflection filter impulse response to perform the windowing.

40. The computer program of claim 38, further comprising an instruction for using one or more points generated upon truncating of the reflection filter impulse response as the reflection filter coefficients.

41. The computer program of claim 37, further comprising an instruction for implementing the reflection filter impulse response as a Finite Impulse Response (FIR) filter.

42. The computer program of claim 37, further comprising instructions for generating the spectrum response from the determined step response by:
differentiating the determined step response to generate an impulse response of the determined step response; and
determining a Discrete Fourier Transform (DFT) of the impulse response of the determined step response.

43. The computer program of claim 37, further comprising instructions for generating the spectrum response from the required step response by:
differentiating the required step response to generate an impulse response of the required step response; and
determining a Discrete Fourier Transform (DFT) of the impulse response of the required step response.

44. The computer program of claim 37, further comprising an instruction for determining the time at which a reflection in the determined step response begins to be at a time after any effects on the signal due to ringing and overshoot have substantially settled.

45. The computer program of claim 37, further comprising an instruction for processing the result of the dividing step to generate a reflection filter impulse response by performing an inverse Fourier Transform on the result of the dividing step.

46. The computer program of claim 37, wherein the determined step response is an average of a number of acquired step responses derived from said signal.

* * * * *